(12) United States Patent
Cheng et al.

(10) Patent No.: US 9,947,533 B2
(45) Date of Patent: *Apr. 17, 2018

(54) SELECTIVE EPITAXY USING EPITAXY-PREVENTION LAYERS

(71) Applicant: INTERNATIONAL BUSINESS MACHINES CORPORATION, Armonk, NY (US)

(72) Inventors: Cheng-Wei Cheng, White Plains, NY (US); Jeehwan Kim, Los Angeles, CA (US); John A. Ott, Greenwood Lake, NY (US); Devendra K. Sadana, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/343,078

(22) Filed: Nov. 3, 2016

(65) Prior Publication Data

US 2017/0053796 A1    Feb. 23, 2017

Related U.S. Application Data

(63) Continuation of application No. 14/645,894, filed on Mar. 12, 2015, now Pat. No. 9,530,643.

(51) Int. Cl.
*H01L 21/20* (2006.01)
*H01L 21/027* (2006.01)
(Continued)

(52) U.S. Cl.
CPC ...... *H01L 21/0274* (2013.01); *H01L 21/0254* (2013.01); *H01L 21/02378* (2013.01);
(Continued)

(58) Field of Classification Search
CPC .......... H01L 21/0274; H01L 21/02642; H01L 21/02612
(Continued)

(56) References Cited

U.S. PATENT DOCUMENTS 8,900,977 B2    12/2014 Wei et al.
9,530,643 B2 *  12/2016 Cheng ............... H01L 21/02444
(Continued)

FOREIGN PATENT DOCUMENTS

| CN | 104051239 A | 9/2014 |
| KR | 1020120083084 A | 7/2012 |
| KR | 1020140096863 A | 8/2014 |

OTHER PUBLICATIONS

Rangarajan, A. et al., "Graphene as an etch mask for silicon," Abstract Submitted for the MAR13 Meeting of the American Physical Society, University of Illinois at Urbana-Champaign, Nov. 2012. (1 Page).

(Continued)

*Primary Examiner* — Anthony Ho
(74) *Attorney, Agent, or Firm* — Tutunjian & Bitetto, P.C.; Louis J. Percello

(57) ABSTRACT

A method for forming an epitaxial structure includes providing a two-dimensional material on a crystal semiconductor material and opening up portions of the two-dimensional material to expose the crystal semiconductor material. A structure is epitaxially grown in the portions opened up in the crystal semiconductor material such that the epitaxial growth is selective to the exposed crystal semiconductor material relative to the two-dimensional material.

17 Claims, 5 Drawing Sheets

(51) Int. Cl.
*H01L 21/02* (2006.01)
*H01L 21/308* (2006.01)

(52) U.S. Cl.
CPC .. *H01L 21/02444* (2013.01); *H01L 21/02485* (2013.01); *H01L 21/02527* (2013.01); *H01L 21/02612* (2013.01); *H01L 21/02639* (2013.01); *H01L 21/02642* (2013.01); *H01L 21/308* (2013.01)

(58) Field of Classification Search
USPC ........................................................ 438/478
See application file for complete search history.

(56) References Cited

U.S. PATENT DOCUMENTS

2012/0248414 A1  10/2012  Kim et al.
2013/0293100 A1  11/2013  Moody
2014/0220481 A1  8/2014  Kim et al.
2014/0225235 A1  8/2014  Du

OTHER PUBLICATIONS

Rangarajan, A., "Graphene Etch Mask for Silicon," Thesis Submitted in partial fulfillment of the requirements for the degree of Master of Science in Electrical and Computer Engineering in the Graduate College of the University of Illinois at Urbana-Champaign, 2014. (38 Pages).

Hirota, Y. et al., "Selective growth of (001) GaAs using a patterned graphene mask," Journal of Crystal Growth, vol. 401, Mar. 2014. (pp. 563-566).

List of IBM Patents or Patent Applications Treated as Related dated Nov. 3, 2016, 2 pages.

* cited by examiner

SELECTIVE EPITAXY USING EPITAXY-PREVENTION LAYERS

BACKGROUND

Technical Field

The present invention relates to epitaxy processing for semiconductor material growth, and more particularly to devices and methods for growing epitaxial materials using a prevention layer formed from a two-dimensional material.

Description of the Related Art

Epitaxial growth processes often open up an oxide or nitride layer to expose a monocrystalline substrate. The monocrystalline substrate provides the crystal structure for the epitaxially grown material. The oxide or nitride layer shields portions of the substrate to direct growth at specific locations on the substrate. However, it is difficult to completely prevent epitaxy on the oxide or nitride layer. Nucleation almost always occurs on the surface of the oxide or nitride layer with broken-bonds being present. The epitaxial growth on the layer also affects etching selectivity for the layer's removal in later steps due to the build-up of material from the epitaxial deposition.

SUMMARY

A method for forming an epitaxial structure includes providing a two-dimensional material on a crystal semiconductor material and opening up portions of the two-dimensional material to expose the crystal semiconductor material. A structure is epitaxially grown in the portions opened up in the crystal semiconductor material such that the epitaxial growth is selective to the exposed crystal semiconductor material relative to the two-dimensional material.

Another method for forming an epitaxial structure includes providing a two-dimensional material on a semiconductor substrate; patterning the two-dimensional material by opening up portions to expose the semiconductor substrate; selectively growing a structure on exposed portions of the semiconductor substrate using an epitaxial growth process such that the epitaxial growth is selective to the exposed crystal semiconductor material relative to the two-dimensional material; removing the two-dimensional material; and processing the structure to form an electronic device.

Yet another method for forming an epitaxial structure includes providing a graphene layer on a silicon carbide substrate; patterning the graphene layer to expose portions of the substrate; and epitaxially growing a semiconductor structure in the portions of the substrate such that the epitaxial growth is selective to the portions exposed on the substrate relative to the graphene.

These and other features and advantages will become apparent from the following detailed description of illustrative embodiments thereof, which is to be read in connection with the accompanying drawings.

BRIEF DESCRIPTION OF THE DRAWINGS

The disclosure will provide details in the following description of preferred embodiments with reference to the following figures wherein.

DETAILED DESCRIPTION

Figure 1:
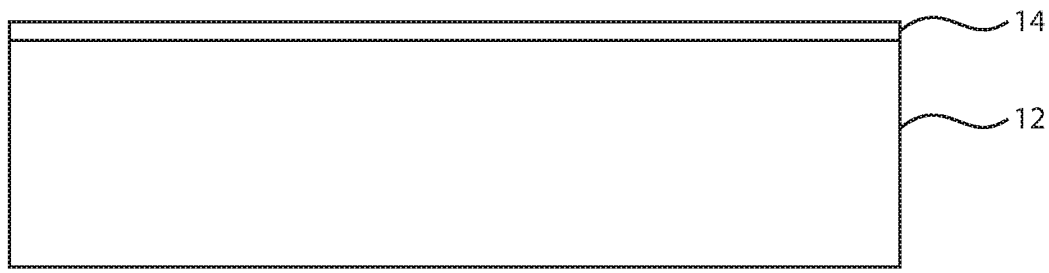
FIG. 1 is a cross-sectional view showing a substrate having a two-dimensional material provided thereon in accordance with the present principles.

In accordance with the present principles, an epitaxial prevention layer is provided to conduct highly selective epitaxial deposition on a substrate or other semiconductor layer. The epitaxial prevention layer includes a two-dimensional (2D) material, such as graphene, $MoS_2$, $WS_2$, etc. Using the 2D material as an epitaxy-prevention layer, no broken bonds ($sp^2$ bonding) occur on the surface of the 2D material as it is easier to control the nucleation on the surface of these $sp^2$ bonded materials. Without these broken bonds, epitaxial growth is more selective to exposed substrate portions or other layers and growth is significantly reduced on the 2D materials. In accordance with the present principles, this approach may be employed for fabricating semiconductor devices, such as light emitting diodes (LEDs), field effect transistors, lasers and any other electronic or photonic device.

2D materials can be transferred or grown on a wafer before epitaxial growth is performed and then by using, e.g., lithography, the area that needs to have epitaxial growth can be patterned in the 2D materials. After the epitaxial growth, the 2D material is removed by, e.g., dry etching, such as, e.g., $O_2$ plasma etching for graphene.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for an integrated circuit chip or photonic device may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips or photonic devices. The resulting integrated circuit chips or photonic devices can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip or device is then integrated with other chips, discrete circuit elements, and/or other signal processing devices as part of either (a) an intermediate product, such as a motherboard, light source, etc., or (b) an end product. The end product can be any product that includes integrated circuit chips, ranging from toys and other low-end applications to advanced computer products having a display, a keyboard or other input device, and a central processor or any device that includes light emitting diodes or other photonic devices.

It should also be understood that material compounds will be described in terms of listed elements, e.g., GaN, AlGaN, SiC, etc. These compounds include different proportions of the elements within the compound, e.g., GaN includes $Ga_x$, $N_{1-x}$, where x is less than or equal to 1, or SiC includes $Si_xC_{1-x}$ where x is less than or equal to 1, etc. In addition, other elements may be included in the compound and still function in accordance with the present principles. The compounds with additional elements will be referred to herein as alloys.

The present embodiments may be part of a photonic device or circuit, and the circuits as described herein may be part of a design for an integrated circuit chip, a printed wiring board, a display device, appliances, a light emitting device, etc.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Referring now to the drawings in which like numerals represent the same or similar elements and initially to FIG. 1, a cross-sectional view of a substrate 12 having a 2D material 14 formed or transferred thereon is shown in accordance with one illustrative embodiment. The substrate 12 may include a monocrystalline semiconductor material, such as SiC, Si, Ge, SiGe, GaAs, InGaAs or any other suitable substrate material. The 2D layer 14 may include graphene, $MoS_2$, $WS_2$ or any other suitable 2D material. A two-dimensional (2D) material may include a material with strong bonds in two dimensions and weak bonds in a third dimension. A 2D material may include weak Van der Waals forces perpendicular to a layer (weak vertical bonding) such that the material separates easily along atomic layers or strata (e.g., strength in 2D directions). Such 2D materials include saturated bonds (e.g., $sp^2$ bonds) along their horizontal surfaces.

In one embodiment, the 2D material includes graphene, and the graphene may be formed on a SiC substrate 12. In such an embodiment, graphene may be employed for 2D material 14 and may be formed by a thermal decomposition of the (0001) face of a SiC wafer (substrate 12). Si removal from the SiC surface results in the formation of graphene at the surface of SiC. In another embodiment, epitaxial carbon monolayer deposition may be employed to form graphene on the surface of the SiC substrate 12.

Graphene may be formed by heating SiC substrates to temperatures greater than 1000 degrees C. resulting in Si evaporation out from the substrates leaving one or more monolayers of single crystalline carbon (graphene). Any single crystalline material whose lattice matches the SiC substrate 12, e.g., the graphene lattice matches well to SiC substrates), can be grown on top of graphene.

Epitaxial graphene can be grown on semi-insulating 4H- or 6H-(0001) SiC wafer surfaces within an induction-heated graphite susceptor located in an evacuation chamber (e.g., a stainless steel vacuum chamber or quartz tube furnace) using a multistep process comprising surface preparation steps. For example, these steps may include annealing at 810° C. for 10 min and 1140° C. for 7 min under flow of 20% disilane in He, or annealing at a temperature around 1600° C. in $H_2$ gas. Then, a graphenization step is employed at about 1450-1620 degrees C. under Ar flow at a chamber pressure from 3.5 mTorr to 900 mTorr for durations of 5 min to 2 hours. Other process parameters are also contemplated.

While a crystalline graphene layer may be employed, in other embodiments, a polycrystalline graphene may be grown on a foil, such as a Cu foil using, e.g., chemical vapor deposition or other processes. Although electrical quality of this graphene is lower than SiC graphene, the $sp^2$ surface remains bonded. Transferring polycrystalline graphene to a Si wafer may be performed and then the graphene is employed as an etch mask in any selective epitaxy situation. For example, Ge growth on Si or SiGe growth on Si or SiC growth on Si, etc.

Graphene (2D layer 14) is atomically smooth and when applied to the substrate 12, a small thickness is desired. In one embodiment, the thickness of the graphene layer 14 is preferably 1-5 monolayers, although greater thicknesses may be employed.

In another embodiment, 2D layer 14 may be transferred to the substrate 12 by a transfer process. The transfer process may include the use of a transfer substrate (not shown) to carry the 2D layer 14 to substrate 12 and transfer the 2D layer 14 to the substrate 12.

Figure 2:
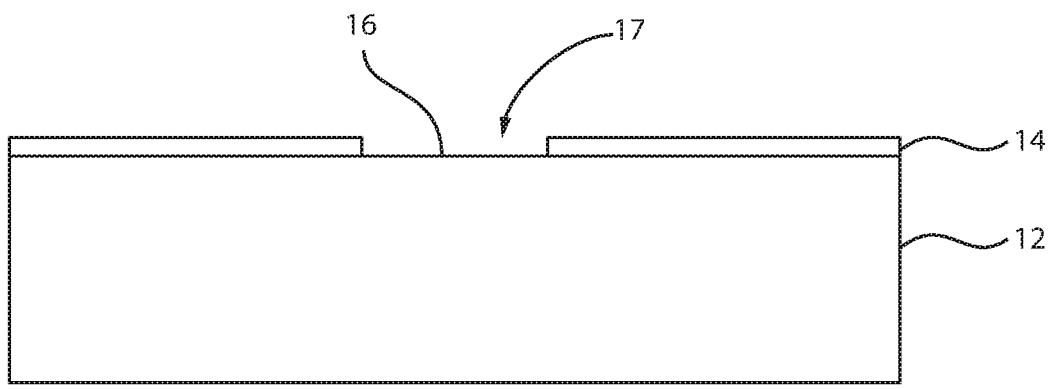
FIG. 2 is a cross-sectional view of FIG. 1 showing the two-dimensional material patterned to expose the substrate in accordance with the present principles.

Referring to FIG. 2, the 2D layer 14 is patterned to form openings 17 therethrough to expose portions of the underlying substrate 12. Patterning may be performed by lithography or other patterning processes. Lithography may include depositing material such as a photoresist or other material and developing the photoresist to form an etch mask. The etch mask includes openings where the 2D layer 14 is exposed and regions that protect portions of the 2D layer 14. The openings where the 2D material 14 is exposed are subjected to an etchant (e.g., a dry or wet etchant) to remove the 2D material 14 in accordance with a pattern and expose the underlying substrate 12 in exposed areas 16. The patterning process may include other materials to form hard masks or the like, and the etching process may include suitable etch chemistries configured to remove the 2D material 14 without significant damage to the substrate 12. If graphene is employed for layer 14, an $O_2$ plasma may be employed to remove the graphene to expose areas 16. The etch mask (not shown) is removed.

Figure 3:
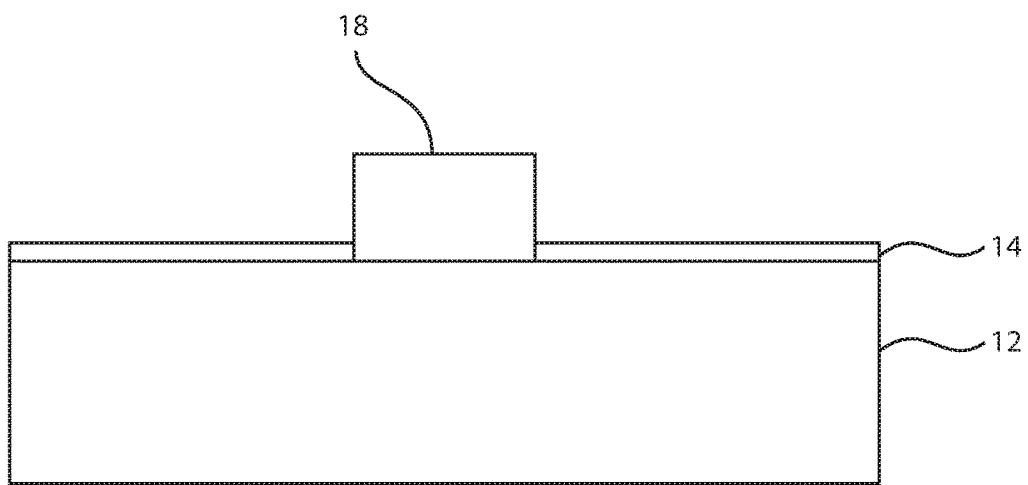
FIG. 3 is a cross-sectional view of FIG. 1 showing an epitaxially grown structure formed on the substrate through the two-dimensional material in accordance with the present principles.

Referring to FIG. 3, exposed areas 16 of substrate 12 provide sites for epitaxial growth. Epitaxial growth may be performed by any number of processes including vapor-phase epitaxy (VPE) (a modification of chemical vapor deposition (CVD)), molecular bean epitaxy (MBE), liquid-phase epitaxy (LPE), Metal-Organic Chemical Vapor Deposition (MOCVD), Organometallic Vapor Phase Epitaxy (OMVPE), etc. The present principles focus on highly selective epitaxial deposition processes; however, the present principles may be employed for other deposition processes as well, e.g., atomic layer deposition, chemical vapor deposition, etc.

By employing the 2D layer 14 as a mask, the occurrence of nucleation due to broken bonds is significantly reduced and as well as the formation of the epitaxial growth product on the 2D material 14. Epitaxially grown material 18 forms selectively on the exposed substrate 12 in regions 16. Epitaxially grown material 18 may form a structure employed in forming an electronic device.

Figure 4:
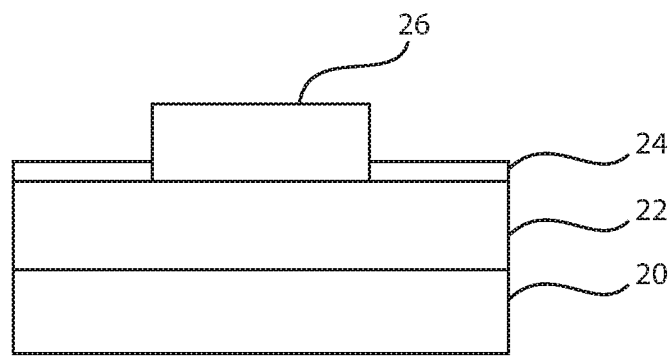
FIG. 4 is a cross-sectional view showing an active layer of a diode epitaxially grown through a two-dimensional material in accordance with the present principles.

Referring to FIG. 4, one embodiment shows steps for forming a diode 30 by highly selective epitaxial growth. Starting with a single crystal substrate 20, intermediary active layers 22 may be formed (with or without the use of a 2D material as will be described). A 2D layer 24 is formed on or transferred to the substrate 20 or intermediary active layer(s) 22 and patterned as described with reference to FIGS. 1 and 2. A semiconductor material 26, such as, e.g., a III-V material, e.g., GaN, InGaN, etc. is epitaxially grown. The 2D layer 24 may include graphene which is etchable with an $O_2$ plasma to pattern the layer 24.

In particularly useful embodiments, intermediary layer 22 may include a p-doped (or n-doped) layer, while layer 26 may include an oppositely doped layer from layer 22 (n-doped or p-doped, respectively). The layers 22 and 26 form a p-n junction of the diode 30. In one embodiment, SiC may be employed for the substrate 20 and GaN may be employed for layers 22 and 26 (e.g., epitaxially grown semiconductor layers). These materials have less lattice-mismatch (closer lattice constants for SiC and GaN). The closer lattice constants result in improved performance and reliability with minimal dislocation density in GaN films.

The structures and processes described herein will refer to LED devices for simplicity; however, the present principles are applicable to any electronic devices, such as transistors, photonic devices, lasers, etc. especially those employing difficult to process III-nitride materials to form electronic devices, in accordance with the present principles.

The diode 30 includes the substrate 20, a p-doped layer 22 (or n-doped) and an n-doped layer 26 (or p-doped). While the structure described and shown in accordance with the present principles is particularly useful for n-type diodes, doping changes and materials may be adjusted to implement the present principles in p-type devices as well. In one embodiment, the substrate 22 may include SiC, a III-V material, such as InP, Si or other substrate material. The p-doped layer 22 may include a p-doped III-V layer (e.g., III-N material, such as GaN). In one embodiment, InGaAs may be employed. The p-doped layer 22 may be selectively grown at predetermined locations by providing a patterned 2D material as described above. The n-doped layer 26 may be epitaxially grown through an opening in the 2D layer 24. The opening in the 2D material 24 locates the device on the layer 22 (or on the substrate 20 if layer 22 is not employed). A III-V material may be employed for n-doped layer 26. The n-type layer may include InGaAs or other III-V material (e.g., III-N, such as GaN). In one particularly useful embodiment, the n-type layer 26 includes a same base material as the p-type layer 22. The 2D material 24 may be removed or may be employed for epitaxially growing additional layers on the n-doped layer 26. The p-doped layer 22 and the n-doped layer 26 are preferably crystalline in form. This preferably includes a monocrystalline structure although a multi-crystal structure may be employed.

Figure 5:
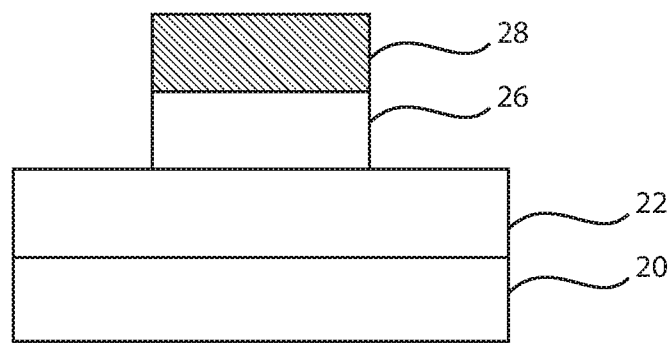
FIG. 5 is a cross-sectional view of FIG. 4 showing a diode formed in accordance with the present principles.

Referring to FIG. 5, a contact 28 is formed on layer 26. The contact 28 may include metal contacts, e.g., Al, W, Pd, Pt, Au, Ag, etc. alone or together in a bi-layer structure. It should be understood that other layers may be employed for diodes having different properties or functions. For example, additional layers, such as blocking layers, active layers (including active layer stacks, e.g., a multiple quantum well (MQW) structure), contact layers, buffer layers, etc. may be employed and at least some of these layers may employ epitaxy prevention layers (2D material) as described herein.

While a diode structure is illustratively shown to demonstrate the present principles, it should be understood that the present principles are applicable to any structure where selective deposition is useful. In one particularly useful application, the structure includes a laser diode or other laser structure. Other embodiments may include passive electrical elements, p-n junctions, etc.

Figure 6:
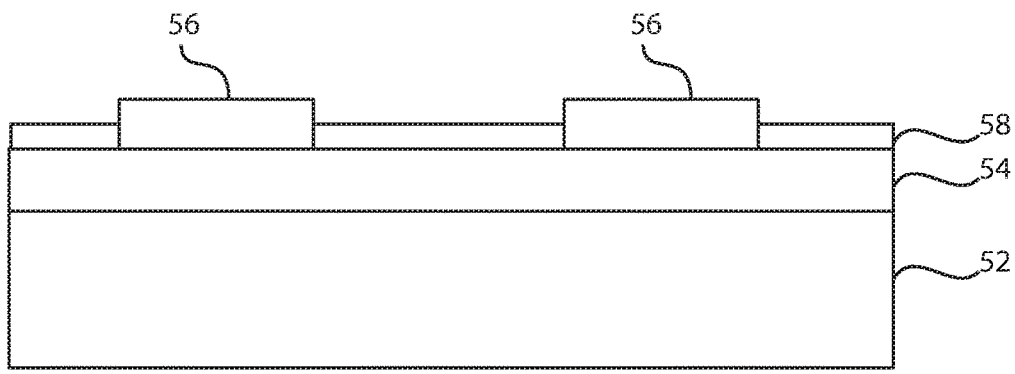
FIG. 6 is a cross-sectional view showing source and drain regions of a field effect transistor epitaxially grown through a two-dimensional material in accordance with the present principles.

Referring to FIG. 6, a cross-section of a partially fabricated field effect transistor (FET) 50 is shown in accordance with one illustrative example. The FET 50 includes a substrate 52, a p-doped layer 54 and n-type source and drain regions 56 formed through openings in a 2D material 58. While the structures described and shown in accordance with the present principles are particularly useful for n-FETs, doping changes and materials may be adjusted to implement the present principles in p-FET devices as well. In one embodiment, the substrate 52 may include SiC, a III-V materials, Si material or other suitable material.

The p-doped layer 54 may include a p-doped InGaAs layer although other III-V materials may be employed. The n-doped layer 56 is preferably crystalline in form and grown epitaxially. This includes a monocrystalline structure and may include a multi-crystal structure.

Figure 7:
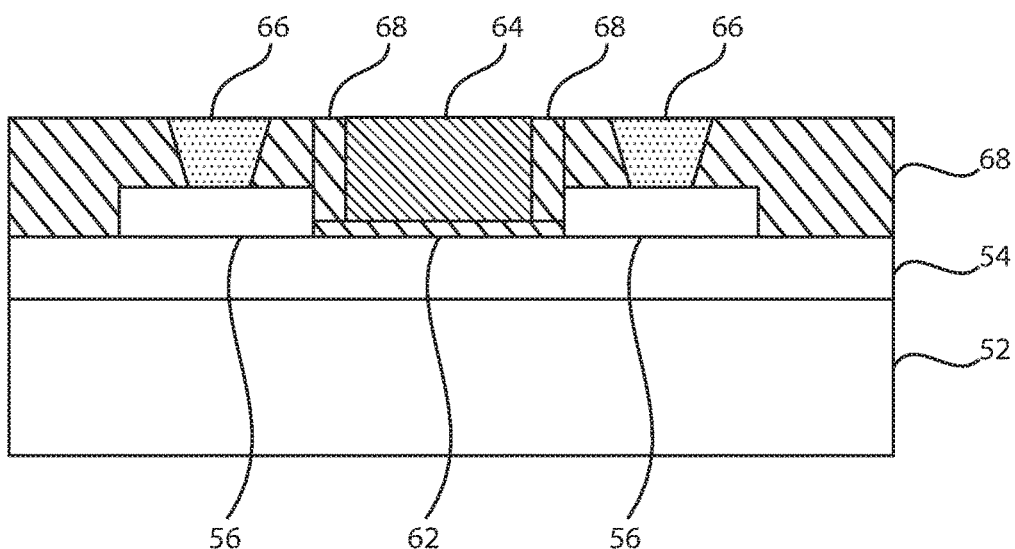
FIG. 7 is a cross-sectional view of FIG. 6 showing a field effect transistor formed in accordance with the present principles.

Referring to FIG. 7, the FET 50 is further processed by forming a gate dielectric 62, e.g., $HfO_2$, $Al_2O_3$, or other high dielectric constant material. A gate electrode 64 and spacers 68 are then formed. The gate electrode 64 may include any suitable highly conductive material, e.g., Cu, Cr, Au, Ag, etc. Contacts 66 are also formed on the S/D regions 56 through a dielectric material 68. The contacts 66 may include contact metals. For example, the FET 50 may include metal contacts in a bi-layer of, e.g., Al and Au. An Al liner may be placed on the S/D regions 56 followed by a highly conductive material such as Au or Pt. Other metals or combinations of metals are also contemplated.

It should be understood that the present principles are not limited to the structures depicted in the FIGS. as these structures are provided for illustration purposes. The present principles may be applied to any type of diode, transistor, junction, device, etc. where an epitaxial film is selectively formed. In particularly useful embodiments, an inverter structure may be formed in accordance with the present principles. For example, an InGaAs nMOSFET (metal oxide semiconductor field effect transistor) and a Ge pMOSFET may be formed. While growing the InGaAs channel on a Si wafer, the pMOSFET area may be covered with graphene to process the nMOSFET. Then, the nMOSFET area can be covered with graphene while growing the Ge pMOSFET channel. Other selective epitaxial growth applications are also contemplated.

Figure 8:
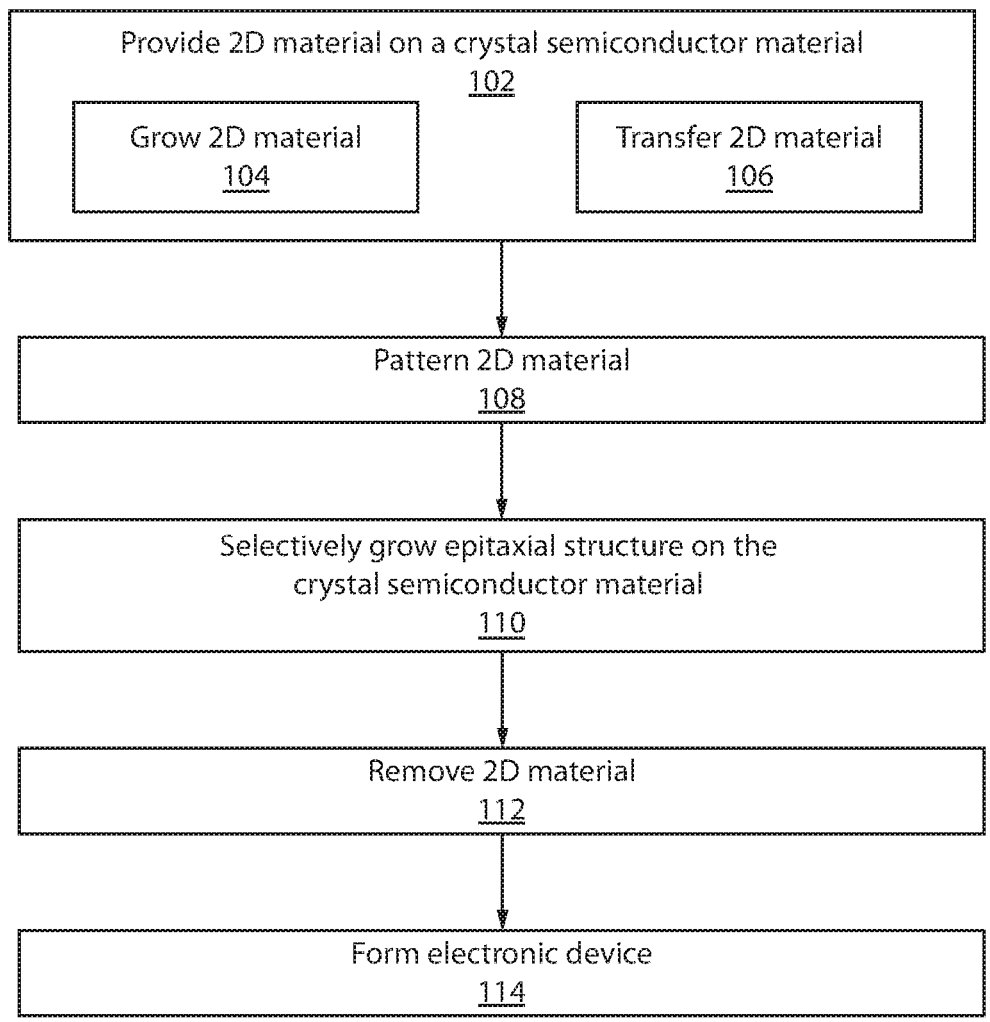
FIG. 8 is a block/flow diagram showing methods for forming an epitaxial structure using an epitaxial prevention layer in accordance with illustrative embodiments.

Referring to FIG. 8, a method for forming an epitaxial structure using epitaxy prevention layers is illustratively shown. The flowcharts in the Figures illustrate the architecture, functionality, and operation of possible implementations of the present invention. In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 102, a two-dimensional (2D) material is provided on a crystal semiconductor material. The crystal semiconductor material may include a substrate or other semiconductor layers. The substrate/layers preferably include monocrystalline material although multi-crystal material may be employed. The substrate or other layers may include any suitable semiconductor suitable for epitaxial growth (e.g., III-V materials, Si, Ge, combinations thereof, etc.). The two dimensional material may include graphene, $MoS_2$, $WS_2$ or any other suitable 2D material. The 2D material may be monocrystalline or polycrystalline.

In block 104, the 2D material may be grown on the underlying layer (crystal semiconductor material) using an epitaxial growth process. The crystal semiconductor material may include SiC, and the 2D material may include a graphene layer, which is grown on the SiC, e.g., a graphenization process may be employed.

In block 106, the 2D material may be transferred from a transfer or handle substrate (e.g., foil) to the crystal semiconductor material. The two-dimensional material is transferred to the crystal semiconductor material by a layer transfer process. The 2D material is adhered or otherwise positioned on the crystal semiconductor material.

In block 108, the 2D material is patterned to expose positions on the crystal semiconductor material where selective epitaxial growth is to be performed. A mask may be employed to pattern the 2D material. In one embodiment, lithographic processing is employed to pattern the 2D material by employing a photoresist mask and etching the 2D material. Lithographic processing is known in the art. The patterning process results in opening up portions of the two-dimensional material to expose the crystal semiconductor material. Opening up portions of the two-dimensional material may include etching into the crystal semiconductor material to ensure a clean surface for epitaxial growth.

In block 110, epitaxially growing a structure in the portions opened up in the crystal semiconductor material such that the epitaxial growth is selective to the exposed crystal semiconductor material relative to the two-dimensional material is performed. The 2D material includes strong bonds in the horizontal plane (plane along the layer), which occupy electrons associated with the atoms of the 2D material. This results in fewer broken bonds and therefore fewer nucleation sites for epitaxial growth on top of the 2D material.

In block 112, the two-dimensional material is preferably removed by an etching process. For example, graphene may be removed using an $O_2$ plasma etch, although other etchants and etching processes may be employed. The 2D material may be employed for forming multiple epitaxially grown layers before removing the 2D material (e.g., to form a stack of selectively grown materials). Since the epitaxial material is not deposited on the surface of the 2D material (e.g., due to lack of nucleation sites), the 2D material is easily removed without deposition of the epitaxial material.

In block 114, the epitaxially formed structure or layer may be employed to form an electronic device. The electronic device may include a transistor, a diode, a laser or any other structure or device.

Having described preferred embodiments for selective epitaxy using epitaxy-prevention layers (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A method for forming an epitaxial structure, comprising:
   opening up portions of a two-dimensional material on a semiconductor material to expose the semiconductor material; and
   epitaxially growing a structure in the portions opened up in the semiconductor material such that the epitaxial growth is selective to the exposed semiconductor material relative to the two-dimensional material.

2. The method as recited in claim 1, wherein the two dimensional material includes graphene.

3. The method as recited in claim 2, wherein the semiconductor material includes SiC and the graphene layer is grown on the SiC.

4. The method as recited in claim 1, wherein the two dimensional material includes $MoS_2$ or $WS_2$.

5. The method as recited in claim 1, wherein opening up portions of the two-dimensional material includes forming an etch mask using lithography and etching the two-dimensional material to open up the portions.

6. The method as recited in claim 1, further comprising removing the two-dimensional material.

7. A method for forming an epitaxial structure, comprising:

patterning a two-dimensional material on a semiconductor substrate by opening up portions of the two-dimensional material to expose the semiconductor substrate;

selectively growing a structure on exposed portions of the semiconductor substrate using an epitaxial growth process such that the epitaxial growth is selective to the exposed semiconductor material relative to the two-dimensional material; and removing the two-dimensional material.

8. The method as recited in claim 1, wherein the two dimensional material includes graphene.

9. The method as recited in claim 8, wherein the semiconductor substrate includes SiC and the graphene layer is grown on the SiC.

10. The method as recited in claim 8, wherein the two dimensional material includes $MoS_2$ or $WS_2$.

11. The method as recited in claim 8, wherein patterning includes forming an etch mask using lithography and etching the two-dimensional material to open up the portions.

12. The method as recited in claim 8, wherein processing the structure includes forming a transistor.

13. The method as recited in claim 8, wherein processing the structure includes forming one of a diode or a laser.

14. A method for forming an epitaxial structure, comprising:

patterning a graphene layer on a silicon carbide substrate to expose portions of the substrate; and epitaxially growing a semiconductor structure in the portions of the substrate such that the epitaxial growth is selective to the portions exposed on the substrate relative to the graphene.

15. The method as recited in claim 14, wherein patterning includes forming an etch mask using lithography and etching the graphene layer to open up the portions.

16. The method as recited in claim 14, wherein providing a graphene layer includes growing the graphene layer on the substrate.

17. The method as recited in claim 14, wherein epitaxially growing a semiconductor structure includes epitaxially growing GaN on the substrate.

* * * * *